United States Patent
Hashimoto

(10) Patent No.: US 9,972,523 B2
(45) Date of Patent: May 15, 2018

(54) ROBOT AND CONTROL METHOD OF ROBOT

(71) Applicant: KAWASAKI JUKOGYO KABUSHIKI KAISHA, Kobe-shi, Hyogo (JP)

(72) Inventor: Yasuhiko Hashimoto, Kobe (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days. days.

(21) Appl. No.: 15/026,926

(22) PCT Filed: Sep. 30, 2014

(86) PCT No.: PCT/JP2014/004987
§ 371 (c)(1),
(2) Date: Apr. 1, 2016

(87) PCT Pub. No.: WO2015/049858
PCT Pub. Date: Apr. 9, 2015

(65) Prior Publication Data
US 2016/0247707 A1  Aug. 25, 2016

(30) Foreign Application Priority Data
Oct. 1, 2013  (JP) ................................. 2013-206634

(51) Int. Cl.
*H01L 21/687* (2006.01)
*B25J 9/04* (2006.01)
(Continued)

(52) U.S. Cl.
CPC ........ *H01L 21/68707* (2013.01); *B25J 9/042* (2013.01); *H01L 21/67778* (2013.01); *H01L 21/68* (2013.01)

(58) Field of Classification Search
CPC ......... H01L 21/68707; H01L 21/67778; H01L 21/68; B25J 9/042
(Continued)

(56) References Cited

U.S. PATENT DOCUMENTS

| 6,056,504 A | * | 5/2000 | Hudgens | .................. | B25J 9/107 |
| | | | | | 414/744.6 |
| 7,547,209 B2 | * | 6/2009 | Asari | ....................... | B25J 9/163 |
| | | | | | 432/239 |

(Continued)

FOREIGN PATENT DOCUMENTS

| JP | 2009-038411 A | 2/2009 |
| JP | 2013-056420 A | 3/2013 |
| WO | 2010/004635 A1 | 1/2010 |

OTHER PUBLICATIONS

Dec. 22, 2014 International Search Report issued in International Patent Application No. PCT/JP2014/004987.
(Continued)

*Primary Examiner* — Jaime Figueroa
(74) *Attorney, Agent, or Firm* — Oliff PLC

(57) ABSTRACT

A robot includes robot arm including lower arm, upper arm and hand attached to tip end portion of upper arm such that the hand is rotatable around rotational axis thereof; lower arm drive unit which drive the lower arm to move the hand, upper arm drive unit which drives the upper arm to move the hand; hand drive unit which rotates the hand; hand angular position detecting section which detects angular position of the hand around the rotational axis; and control unit which controls upper arm drive unit, lower arm drive unit, and hand drive unit, wherein the hand includes a blade having a first contact/slide surface and second contact/slide surface which extend in a first direction, contact a teaching target and slide thereon, and first contact/slide surface and second contact/slide surface include a first characterizing portion and a (Continued)

second characterizing portion having bent points in the first direction, respectively.

8 Claims, 14 Drawing Sheets

(51) Int. Cl.
    *H01L 21/67*     (2006.01)
    *H01L 21/68*     (2006.01)
    *H01L 21/677*     (2006.01)

(58) Field of Classification Search
    USPC .................................................. 700/245, 250
    See application file for complete search history.

(56) References Cited

U.S. PATENT DOCUMENTS

| | | | |
|---|---|---|---|
| 8,121,732 B2* | 2/2012 | Hashimoto | B25J 9/1692 318/568.1 |
| 8,401,701 B2* | 3/2013 | Kimura | B25J 9/1666 318/567 |
| 8,924,118 B2* | 12/2014 | Shin | B25J 9/02 118/52 |
| 8,958,907 B2* | 2/2015 | Saeki | H01L 21/67742 318/567 |
| 9,579,794 B2* | 2/2017 | Masui | B25J 9/1664 |
| 2001/0020199 A1* | 9/2001 | Bacchi | B25J 9/042 700/245 |
| 2003/0205905 A1* | 11/2003 | Chen | H01L 21/67259 294/213 |
| 2004/0013503 A1* | 1/2004 | Sandhu | H01L 21/67766 414/416.08 |
| 2009/0093908 A1 | 4/2009 | Hashimoto et al. | |
| 2010/0150688 A1* | 6/2010 | Kitahara | H01L 21/68707 414/226.02 |
| 2010/0161124 A1* | 6/2010 | Kimura | B25J 9/1666 700/251 |
| 2010/0209225 A1* | 8/2010 | Matsuo | H01L 21/67745 414/744.5 |
| 2011/0118873 A1* | 5/2011 | Hashimoto | B25J 9/1692 700/245 |
| 2011/0160897 A1* | 6/2011 | Shimomura | H01L 21/68707 700/217 |
| 2013/0085606 A1* | 4/2013 | Tagashira | B25J 9/10 700/262 |
| 2013/0183122 A1* | 7/2013 | Mizokawa | H01L 21/67739 414/217.1 |
| 2013/0195584 A1* | 8/2013 | Furuichi | B25J 9/042 414/217 |

OTHER PUBLICATIONS

Apr. 5, 2016 International Preliminary Report on Patentability issued in International Patent Application No. PCT/JP2014/004987.
Oct. 28, 2016 Office Action issued in Chinese Patent Application No. 201480054199.4.

\* cited by examiner

ROBOT AND CONTROL METHOD OF ROBOT

TECHNICAL FIELD

The present invention relates to a robot, and a control method of the robot.

BACKGROUND ART

Conventionally, there is known a robot having a function for teaching the position of a target object such as a semiconductor wafer or a glass wafer.

For example, a robot disclosed in Patent Literature 1 includes a first arm member rotatably attached to a base body, a second arm member having a base end portion attached to the tip end portion of the first arm member such that the second arm member is rotatable, and a hand rotatably attached to the tip end portion of the second arm member. The first arm member is driven to be rotated by a first arm drive means, the second arm member is driven to be rotated by a second arm drive means, and the hand is driven to be rotated by a wrist shaft drive means including a servo motor. In a state in which a control loop gain of the wrist shaft drive means is set to substantially zero, the hand is brought into contact with a target object, thereby the angular position of a wrist shaft fixedly attached to the hand is changed, and the changed angular position of the wrist shaft is detected by an encoder of the servo motor. Based on shape data and dimension data of the hand which are stored in a memory unit, the posture of a robot arm and the angular position of the wrist shaft, at a time point when the hand contacts the target object, the position of the target object within an X-Y flat plane is determined.

A robot disclosed in Patent Literature 2 is provided with a wrist having a horizontal flexibility on the tip end portion of an arm. This wrist is provided with a hand having contact portions. The contact portions include a first inclined portion which is formed on a portion (wrist portion) of the hand, the portion being closer to a wrist shaft than a support portion supporting a wafer is in such a manner that the first inclined portion is inclined toward one side in the circumferential direction of the wrist shaft as the first inclined portion is away from the wrist shaft, and a second inclined portion which is formed at the support portion in such a manner that the second inclined portion is inclined toward the other side in the circumferential direction of the wrist shaft as it is more distant from the wrist shaft, and is continuous with the first inclined portion. In a state in which the contact portion is in contact with the target object, the tip end portion of the arm is moved, the position of the target object in the state in which the contact portion is in contact with the target object, is taken-in, and the position of the target object is detected based on a value in a state in which the target object is located in a portion at which the first inclined portion and the second inclined portion are continuous with each other.

CITATION LIST

Patent Literature

Patent Literature 1: Internal Publication No. 2010/004635
Patent Literature 2: Japanese Laid-Open Patent Application Publication No. 2013-56420

SUMMARY OF INVENTION

Technical Problem

However, in the robot disclosed in Patent Literature 1, which portion of the contact surface the target object contacts cannot be detected. For this reason, to determine the position of the target object in an X-direction and a Y-direction, the hand is required to contact the target object in at least two directions within the X-Y flat plane. Therefore, the robot disclosed in Patent Literature 1 has a problem that the position of the target object cannot be detected quickly.

In the robot disclosed in Patent Literature 2, the position of the target object is detected based on the portion at which the first inclined portion formed in the wrist portion and the second inclined portion formed in the support portion are continuous with each other. Therefore, the robot disclosed in Patent Literature 2 has a problem that it cannot be applied to a conventional end effector.

Solution to Problem

To achieve the above-described object, according to an aspect of the present invention, a robot comprises a robot arm including an arm, and a hand attached to a tip end portion of the arm in such a manner that the hand is rotatable around a rotational axis of the hand; an arm drive unit which drives the arm to move the hand; a hand drive unit which rotates the hand; a hand angular position detecting section which detects an angular position of the hand around the rotational axis; and a control unit which controls the arm drive unit and the hand drive unit, wherein the hand includes a blade having a contact/slide surface which extends in a first direction and contacts a teaching target and slides relatively on the teaching target, and wherein the contact/slide surface includes a characterizing portion having a bent point in the first direction.

In accordance with this configuration, the teaching target and the characterizing portion are caused to contact each other, and the position of the teaching target on a known two-dimensional flat plane (flat plane including the extension axis of the contact/slide surface and being perpendicular to the rotational axis) can be detected based on the changed angular position of the hand, the changed angular position occurring due to the characterizing portion and being detected by the hand angular position detecting section. In this configuration, the position of the teaching target can be detected quickly and teaching with respect to the robot can be performed quickly.

In addition, by additionally processing the conventional blade to form the contact/slide surface including the characterizing portion, the teaching with respect to the conventional robot can be performed. Thus, the robot of the present invention can be easily manufactured at low manufacturing cost.

The characterizing portion may be a stepped portion in the first direction.

In accordance with this configuration, the position of the teaching target can be detected more quickly, and the teaching with respect to the robot can be performed more quickly.

The control unit may be configured to control at least the arm drive unit to move the hand so that the teaching target is moved relatively on the contact/slide surface in the first direction or a direction opposite to the first direction, and to detect a position of the teaching target based on a changed angular position of the hand in a direction crossing the first direction, the changed angular position occurring due to the characterizing portion and being detected by the hand angular position detecting section.

In accordance with this configuration, the hand is moved in such a manner that the teaching target is moved relatively on the contact/slide surface so that the teaching target and the characterizing portion contact each other, and the position of the teaching target on a known two-dimensional flat plane can be detected based on the changed angular position of the hand, the changed angular position being detected by the hand angular position detecting section. In this configuration, the position of the teaching target can be detected quickly and teaching with respect to the robot can be performed quickly.

The control unit may be configured to control the hand drive unit to cause the hand to follow up a change in a shape of the characterizing portion of the contact/slide surface.

In accordance with this configuration, the changed angular position of the hand, occurring due to the characterizing portion, can be made clear, and the position of the teaching target can be detected accurately.

The characterizing portion may be a convex portion protruding from the contact/slide surface or a recess depressed from the contact/slide surface.

In accordance with this configuration, the position of the teaching target can be detected more accurately.

To achieve the above-described object, according to an aspect of the present invention, a method of controlling a robot including: a robot arm including an arm, and a hand attached to a tip end portion of the arm in such a manner that the hand is rotatable around a rotational axis of the hand; an arm drive unit which drives the arm to move the hand; a hand drive unit which rotates the hand; a hand angular position detecting section which detects an angular position of the hand around the rotational axis; and a control unit which controls the arm drive unit and the hand drive unit, wherein the hand includes a blade extending in a first direction and having a contact/slide surface which contacts a teaching target and slides relatively on the teaching target, and wherein the contact/slide surface includes a characterizing portion having a bent point in the first direction, the method comprising: controlling, with the control unit, at least the arm drive unit to move the hand so that the teaching target is moved relatively on the contact/slide surface in the first direction or a direction opposite to the first direction, and detecting a position of the teaching target based on a changed angular position of the hand in a direction crossing the first direction, the changed angular position occurring due to the characterizing portion and being detected by the hand angular position detecting section.

In accordance with this method, the hand is moved in such a manner that the teaching target is moved relatively on the contact/slide surface so that the teaching target and the characterizing portion contact each other, and the position of the teaching target on a known two-dimensional flat plane can be detected based on the changed angular position of the hand, the changed angular position occurring due to the characterizing portion and being detected by the hand angular position detecting section. In this method, the position of the teaching target can be detected quickly and the teaching with respect to the robot can be performed quickly.

In addition, by additionally processing the conventional blade to form the contact/slide surface including the characterizing portion, the teaching with respect to the conventional robot can be performed. Thus, the robot of the present invention can be easily manufactured at low manufacturing cost.

Advantageous Effects of Invention

In accordance with the present invention, the position of a teaching target can be detected quickly.

DESCRIPTION OF EMBODIMENTS

Hereinafter, a robot 100 according to the embodiment of the present invention will be described with reference to the above-described drawings.

Embodiment

Figure 1:
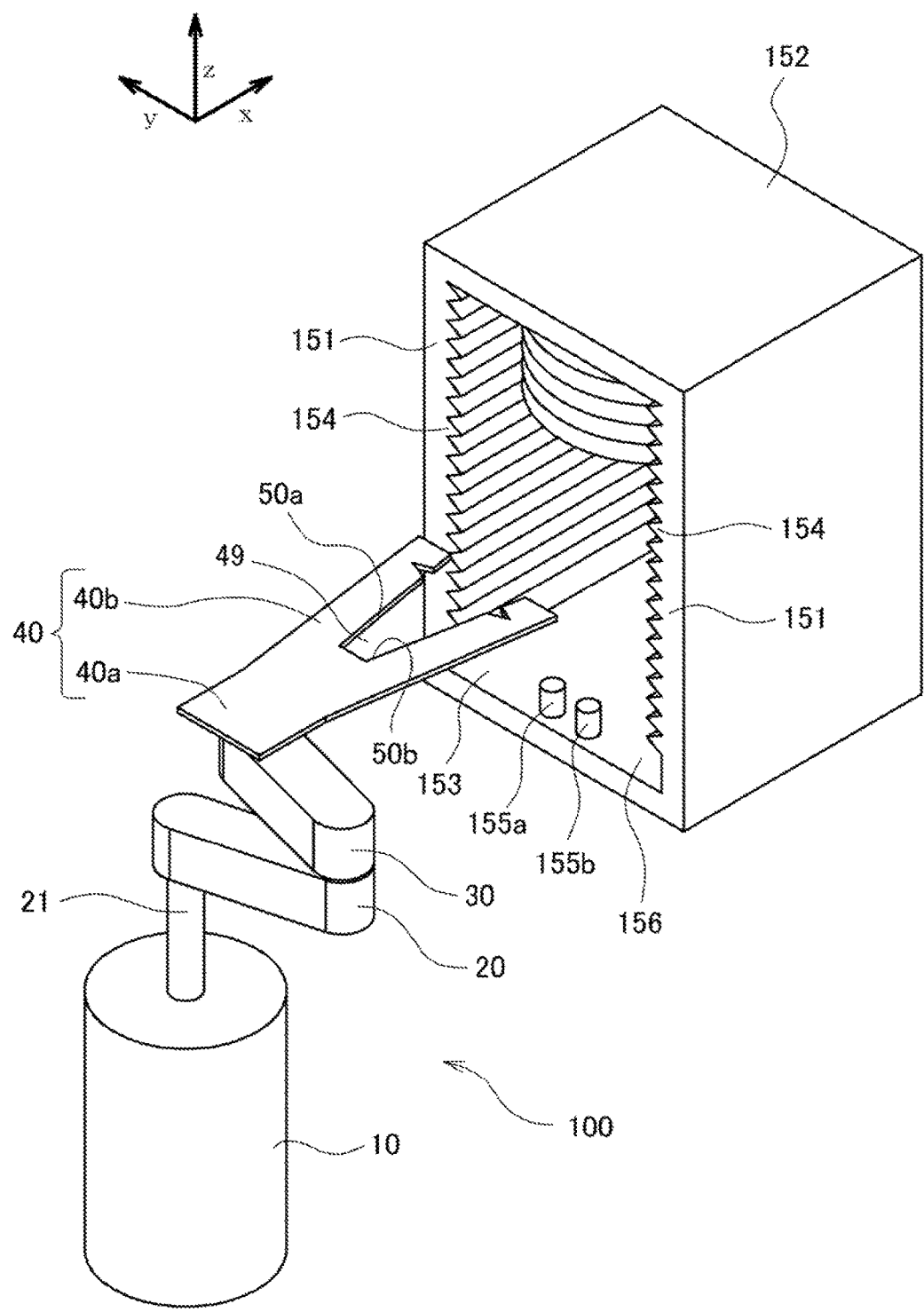
FIG. 1 is a perspective view showing the exemplary configuration of a robot according to the embodiment of the present invention and a FOUP in which substrates are stored.
Figure 2:
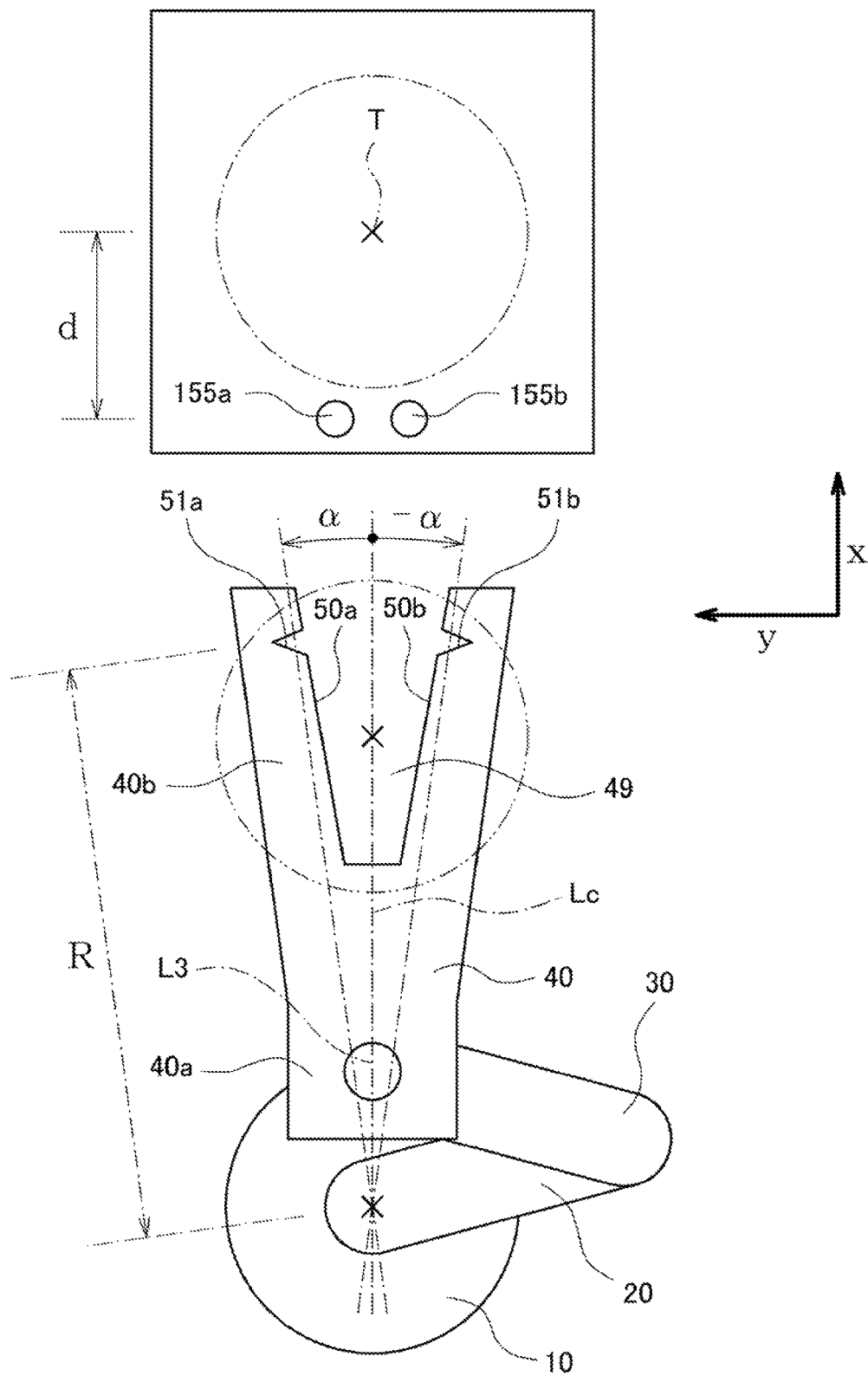
FIG. 2 is a plan view showing the exemplary configuration of the robot and the FOUP of FIG. 1.

FIG. 1 is a perspective view showing the exemplary configuration of a robot according to the embodiment of the present invention and a FOUP in which substrates are stored. FIG. 2 is a plan view showing the exemplary configuration of the robot according to the embodiment of the present invention and the FOUP in which the substrates are stored.

The robot 100 of the present embodiment is a robot which conveys (carries) the substrates such as semiconductor wafers or glass wafers. The robot 100 takes the substrates out of a FOUP (front opening unified pod) 150 and stores the substrates into the FOUP 150. As examples of the semiconductor wafers, there are silicon wafers, sapphire (monocrystal alumina) wafers, or other kinds of wafers. As examples of the glass wafers, there are glass substrate for FPDs (flat panel displays) or glass substrates for MEMS (micro electro mechanical systems).

As shown in FIG. 1, the FOUP 150 includes a pair of side walls 151 facing each other, an upper wall 152 connecting the upper ends of the side walls 151 to each other, a lower wall 153 connecting the lower ends of the side walls 151 to each other, plural pairs of substrate support sections 154 provided on the side walls 151, and first and second teaching targets 155a, 155b. The front surface of the FOUP 150 is open to form a front opening 156. The robot 100 carries the substrates out of the FOUP 150 through the front opening 156, and carries the substrate into the FOUP 150 through the front opening 156.

The substrate support sections 154 support the end portions of plural substrates in such a manner that the plural substrates are arranged to extend horizontally and are vertically spaced apart from each other. As shown in FIG. 2, for example, the center of each of the substrates supported on the substrate support sections 154 when viewed from a vertical direction is a teaching point T, but this is merely exemplary. The teaching point T is defined as a position which is detected by a control unit 61 (which will be described later) of the robot 100 so the robot 100 can carry the substrate out of the FOUP 150 and carry the substrate P into the FOUP 150, based on the detected position Hereinafter, a direction in which a rotational axis L1 (which will be described later) of the robot 100 will be referred to as a z-direction, a direction perpendicular to the z-direction will be referred to as an x-direction, and a direction perpendicular to the z-direction and the x-direction will be referred to as a y-direction. In the present embodiment, the x-direction is set to a direction from the robot 100 toward the FOUP 150 and a direction opposite to the direction from the robot 100 toward the FOUP 150.

Each of the first teaching target 155a and the second teaching target 155b has for example, a columnar (cylindrical) shape, and protrudes upward from the lower wall 153. The first teaching target 155a and the second teaching target 155b are aligned in a direction from one of the side walls 151 toward the other of the side walls 151. A positional relationship between the first and second teaching targets 155a, 155b, and the teaching point T, on an x-y flat plane, is pre-stored in a memory unit 62 which will be described later. In the present embodiment, the teaching point T is located at a distance d from the center of a line connecting the first teaching target 155a to the second teaching target 155b, in a direction in which a line orthogonal to the line connecting the first teaching target 155a to the second teaching target 155b extends. The memory unit 62 contains, for example, the distance d.

[Configuration of Robot]

Figure 3:
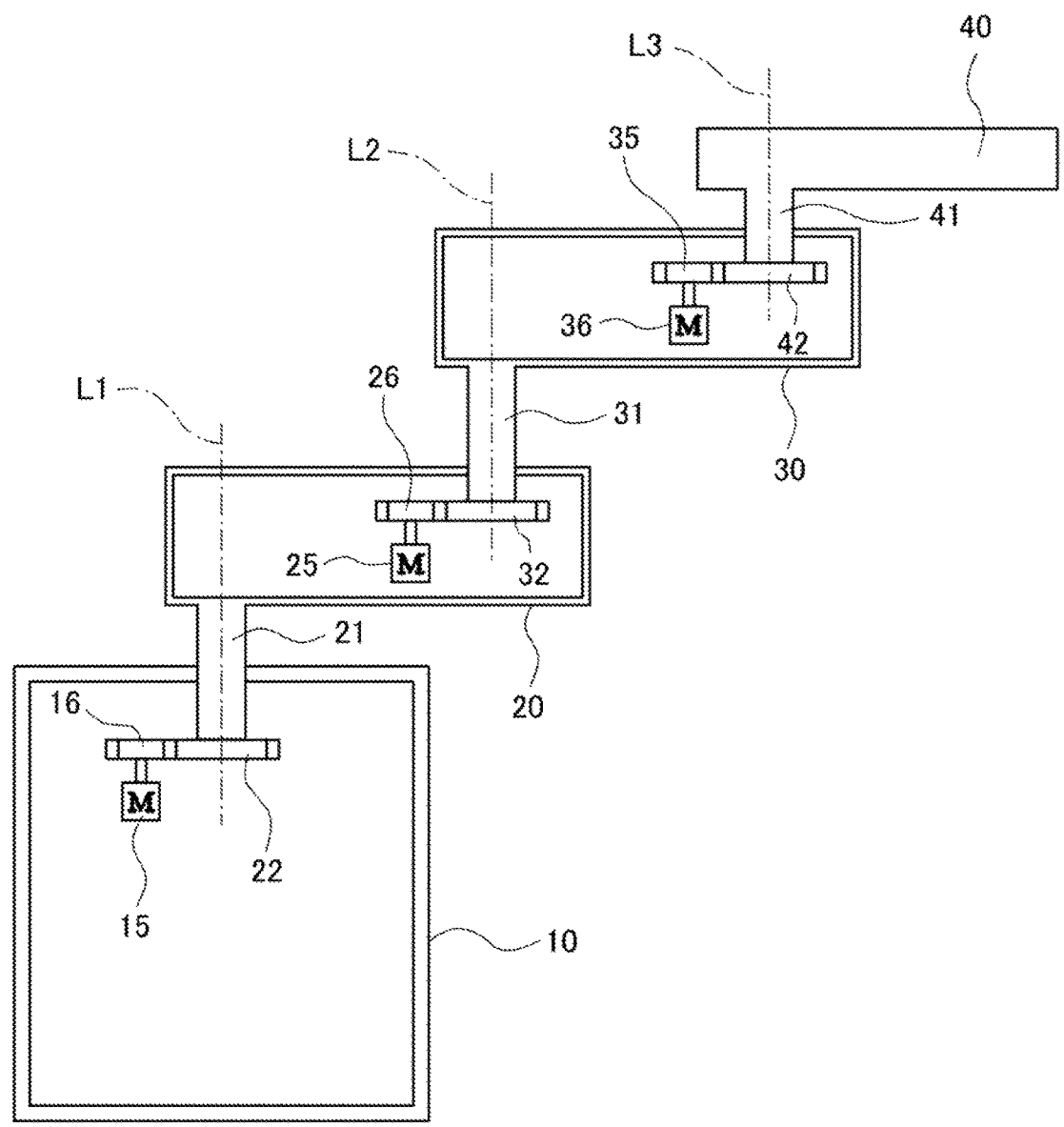
FIG. 3 is a view schematically showing the exemplary configuration of the internal mechanism of the robot of FIG. 1.

FIG. 3 is a view schematically showing the exemplary configuration of the internal mechanism of the robot 100.

As shown in FIG. 3, the robot 100 includes a base body 10, a lower arm 20, an upper arm 30, a hand 40, and a controller 60 (see FIG. 4) for controlling the operation of the robot 100. The lower arm 20 and the upper arm 30 constitute an arm of the robot 100. The lower arm 20, the upper arm 30, and the hand 40 constitute a robot arm of the robot 100.

The base body 10 is, for example, a hollow cylindrical member. In the interior of the base body 10, a lower arm drive unit 15 including a servo motor is accommodated. The lower arm drive unit 15 includes a lower arm rotation drive gear 16.

Figure 4:
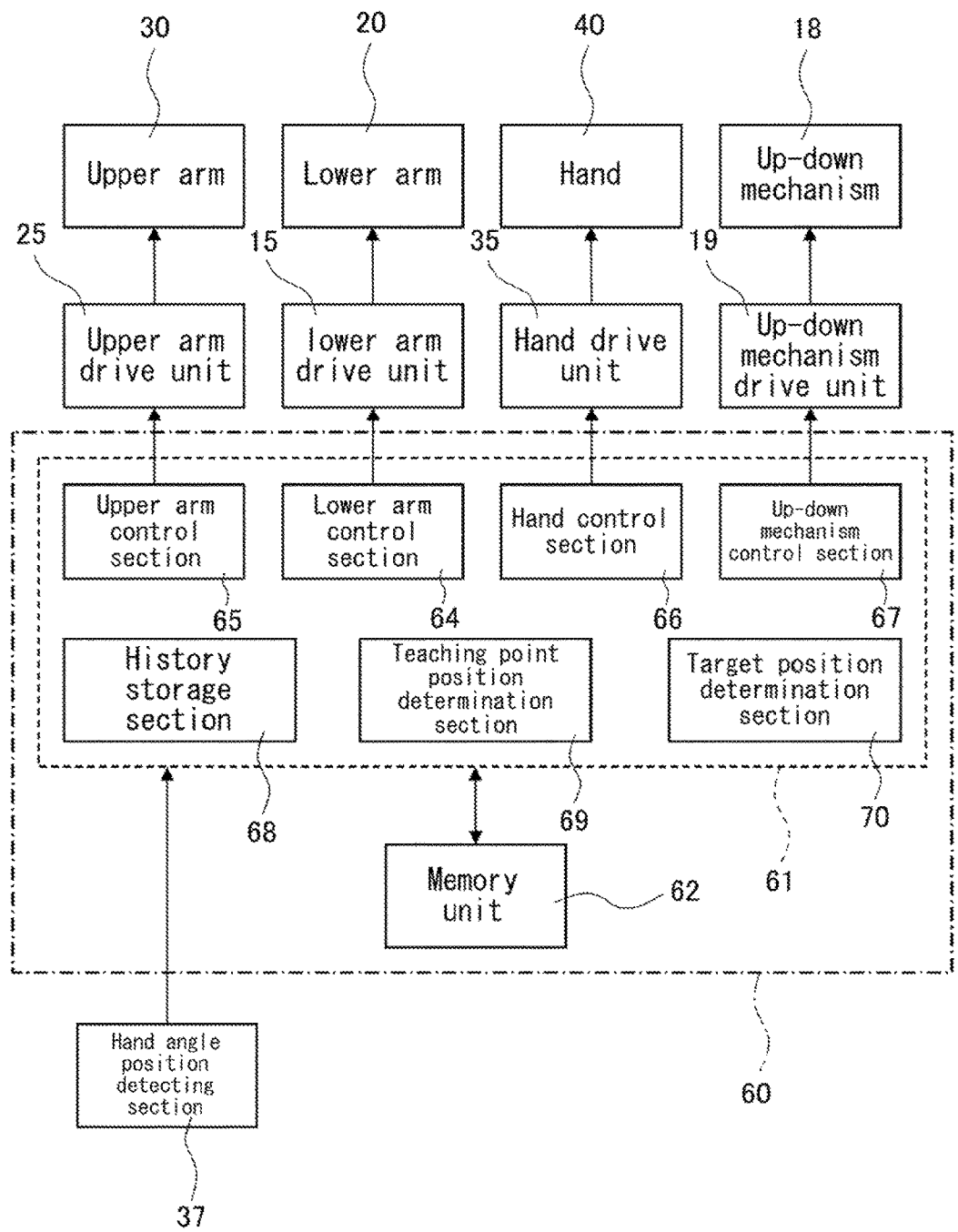
FIG. 4 is a block diagram schematically showing the exemplary configuration of the control system of the robot of FIG. 1.

The robot 100 includes an up-down mechanism 18 (see FIG. 4). The up-down mechanism 18 includes, for example, a well-known ball screw mechanism (not shown) and a servo motor with an encoder (up-down mechanism drive unit 19) which drives the ball screw mechanism. The ball screw mechanism moves up or down a movable member (not shown) to which a lower arm rotary shaft 21 and the lower arm drive unit 15 are attached, to thereby move up or down the lower arm 20, the upper arm 30, and the hand 40 together, in the z-direction. This allows the hand 40 to be moved up or down, between an up position and a down position. The height position of the down position is set to be lower than the height position of the lower wall 153 of the FOUP 150. The height position of the up position is set to be higher than the height position of the substrate support sections 154 on an uppermost side.

The lower arm 20 is, for example, a hollow plate member, and has a substantially elongated rectangular shape, when viewed from above. As shown in FIG. 3, the lower arm 20 is formed with a lower arm rotary shaft 21 protruding downward from the bottom surface of the base end portion of the lower atm 20. The lower arm rotary shaft 21 is mounted to the base body 10 in such a manner that the lower arm rotary shaft 21 is rotatable around a rotational axis L1 extending in the z-direction. In other words, the lower arm 20 is configured to rotate on the x-y flat plane. In the present embodiment, the rotational axis L1 constitutes a reference point O on the x-y flat plane.

A lower arm rotation driven gear 22 is fixed to the lower end portion of the lower arm rotary shaft 21. The lower arm rotation driven gear 22 is provided on the lower arm rotary shaft 21 in such a manner that the height position of the lower arm rotation driven gear 22 conforms to the height position of the lower arm rotation drive gear 16 of the base body 10. The lower arm rotation driven gear 22 is in mesh with the lower arm rotation drive gear 16. The lower arm 20 contains therein an upper arm drive unit 25 containing a servo motor therein. The upper atm drive unit 25 is provided with an upper arm rotation drive gear 26.

The relative angular position of the lower arm 20 with respect to the base body 10, around the rotational axis L1, is detected by the encoder of the servo motor of the lower arm drive unit 15.

The upper arm 30 is, for example, a hollow plate member, and has a substantially elongated rectangular shape, when viewed from above. As shown in FIG. 3, the upper atm 30 is provided with an upper arm rotary shaft 31 protruding downward from the bottom surface of a base end portion 30a of the upper arm 30. The upper arm rotary shaft 31 is mounted to the lower arm 20 in such a manner that the upper arm rotary shaft 31 is rotatable around a rotational axis L2 extending in parallel with the rotational axis L1. In other words, the upper arm 30 is configured to rotate on the x-y flat plane.

An upper arm rotation driven gear 32 is fixed to the lower end portion of the upper arm rotary shaft 31. The upper arm rotation driven gear 32 is provided on the upper arm rotary shaft 31 in such a manner that the height position of the upper arm rotation driven gear 32 conforms to the height position of the upper arm rotation drive gear 26 of the lower arm 20. The upper arm rotation driven gear 32 is in mesh with the upper arm rotation drive gear 26. The upper arm 30 contains therein a hand drive unit 35 including a servo motor. The hand drive unit 35 is provided with a hand rotation drive gear 36.

The relative angular position of the upper arm 30 with respect to the lower arm 20, around the rotational axis L2, is detected by the encoder of the servo motor of the upper arm drive unit 25.

The hand 40 includes a wrist 40a provided on the base end side of the hand 40 (on a portion of the hand 40 which is closer to the base end of the hand 40), and a blade 40b provided on the tip end side of the hand 40 (on a portion of the hand 40 which is closer to the tip end of the hand 40). The wrist 40a and the blade 40b are configured to be continuous with each other.

The wrist 40a includes a hand rotary shaft 41 protruding downward from the bottom surface of the base end portion 40a of the wrist 40a. The hand rotary shaft 41 is mounted to the hand 40 in such a manner that the hand rotary shaft 41 is rotatable around a rotational axis L3 extending in parallel with the rotational axes L1, L2. In other words, the hand 40 is configured to rotate on the x-y flat plane.

A hand rotation driven gear 42 is fixed to the lower end portion of the hand rotary shaft 41. The hand rotation driven gear 42 is mounted on the hand rotary shaft 41 in such a manner that the height position of the hand rotation driven gear 42 conforms to the height position of the hand rotation drive gear 36. The hand rotation driven gear 42 is in mesh with the hand rotation drive gear 36.

The relative angular position of the hand 40 with respect to the upper arm 30, around the rotational axis L3, is detected by the encoder of the servo motor of the hand drive unit 35. This encoder constitutes a hand angular position detecting section 37, but this configuration is merely exemplary.

The above-described lower arm drive unit 15 and upper arm drive unit 25 constitute an arm drive unit. The arm drive unit operates to drive the lower arm 20 and the upper arm 30, to move the hand 40 on the x-y flat plane.

The blade 40b has, for example, a thin plate shape. The blade 40b serves to retain the substrate P on its upper surface. The blade 40b has a contact/slide surface configured to contact the teaching target and slide relatively on the teaching target. In the present embodiment, this contact/slide surface includes a pair of surfaces facing each other. The pair of contact/slide surfaces facing each other are formed as portions of the inner peripheral surface of a hollow portion 49 of the blade 40b of the thin plate shape, the hollow portion 49 being formed by cutting out a portion from the blade 40b. The pair of contact/slide surfaces facing each other extend to form a space between them, the space having a dimension decreased from the tip end portion of the blade 40b toward the base end portion of the blade 40b. More specifically, in a direction from the tip end portion of the blade 40b toward the base end portion of the blade 40b, each of the pair of contact/slide surfaces facing each other extends to be gradually close to a center line Lc extending through the rotational axis L3 and from the base end of the blade 40b toward the tip end of the blade 40b. That is, each of the pair of contact/slide surfaces facing each other extends in a direction crossing the rotational direction of the hand 40 (in the present embodiment, a direction orthogonal to the rotational direction of the hand 40). In a state in which the hand 40 is positioned in such a manner that the direction from the base end of the blade 40b toward the tip end of the blade 40b conforms to the x-direction, the contact/slide surface, of the pair of contact/slide surfaces facing each other, which is closer to the first teaching target 155a of the FOUP 150 rather than the second teaching target 155b of the FOUP 150, constitutes a first contact/slide surface 50a, while the contact/slide surface, of the pair of contact/slide surfaces facing each other, which is closer to the second teaching target 155b rather than the first teaching target 155a, constitutes a second contact/slide surface 50b. In the present embodiment, each of the first contact/slide surface 50a and the second contact/slide surface 50b is a continuous surface extending in a straight-line shape, as a whole.

The first contact/slide surface 50a has a bent point in a direction (first direction) in which the first contact/slide surface 50a extends. In the same manner, the second contact/slide surface 50b has a bent point in a direction in which the second contact/slide surface 50b extends.

In the present embodiment, the bent point of the first contact/slide surface 50a is a notch formed by carving the first contact/slide surface 50a, and is configured as a recess which is depressed from the first contact/slide surface 50a extending in a straight-line shape. In this configuration, the notch forms a stepped portion in the direction (first direction) in which the first contact/slide surface 50a extends. This stepped portion constitutes a first characterizing portion 51a. In other words, the stepped portion of the first contact/slide surface 50a constitutes a point at which the first contact/slide surface 50a extends discontinuously.

In the present embodiment, the bent point of the second contact/slide surface 50b is a notch formed by carving the second contact/slide surface 50b, and is configured as a recess which is depressed from the second contact/slide surface 50b extending in a straight-line shape. In this configuration, the notch forms a stepped portion in the direction in which the second contact/slide surface 50b extends. This stepped portion constitutes a second characterizing portion 51b. In other words, the stepped portion of the second contact/slide surface 50b constitutes a point at which the second contact/slide surface 50b extends discontinuously.

Further, in the present embodiment, the first characterizing portion 51a and the second characterizing portion 51b are line-symmetric with respect to the center line Lc, on the x-y flat plane.

Information used to identify the position of the first characterizing portion 51a and information used to identify the position of the second characterizing portion 51b are stored in the memory unit 62, as will be described in detail later. These information are used to determine the positions of the first and second teaching targets 155a, 155b and to determine the positions of the teaching points.

[Control Unit]

FIG. 4 is a block diagram schematically showing the exemplary configuration of the control system of the robot 100.

The robot 100 includes the controller 60. The controller 60 includes, for example, the control unit 61 including a processor such as a CPU, and the memory unit 62 including a memory such as an ROM and an RAM. The controller 60 may be configured as a single controller which performs centralized control, or may be configured to include a plurality of controllers which cooperate with each other to perform distributed control. The control unit 61 includes a lower arm control section 64, an upper arm control section 65, a hand control section 66, an up-down mechanism control section 67, a history storage section 68, a teaching point position determination section 69, and a target position determination section 70. These functional sections 64 to 70 are functional blocks performed by the fact that the control unit 61 executes specified control programs stored in the memory unit 62.

The lower arm control section 64 controls the lower arm drive unit 15 to rotate the lower arm 20 on the x-y flat plane.

The upper arm control section 65 controls the upper arm drive unit 25 to rotate the upper arm 30 on the x-y flat plane.

The hand control section 66 controls the hand drive unit 35 to rotate the hand 40 on the x-y flat plane.

The up-down mechanism control section 67 controls the up-down mechanism drive unit 19 to move up or down the lower arm 20, the upper arm 30, and the hand 40 together, in the z-direction.

In the present embodiment, for example, a main control section (not shown) of the control unit 61 outputs target angular positions to the control sections 64 to 67, respectively, based on the target conveying position of the robot 100 and the angular positions detected by the encoders of the drive units 15, 25, 35, 19, respectively. The control sections 64 to 67 perform feedback control of the corresponding drive units 15, 25, 35, 19 based on the angular positions detected by the corresponding encoders, respectively so that the angular positions of the corresponding controlled target objects (the lower arm 20, the upper arm 30, the hand 40, and the movable member) become the target angular positions, respectively.

The control unit 61 stores in the history storage section 68, information including control information of the lower arm 20, the upper arm 30, and the hand 40, and the information relating to the angular position of the hand 40 which is received from the hand angular position detecting section 37. In the present embodiment, this information includes information required to identify a relationship between the position of the rotational axis L3 and the angular position of the hand 40.

The target position determination section 70 determines the position of the first teaching target 155*a* and the position of the second teaching target 155*b*, based on the information stored in the history storage section 68. This will be described in detail later.

The teaching point position determination section 69 determines the position of the teaching point T, based on the target position determined by the target position determination section 70. This will be described in detail later.

The memory unit 62 contains the specified control programs. The control unit 61 reads and executes these control programs. In this way, the operation of the robot 100 is controlled. As described above, the memory unit 62 contains the distance d in the x-direction from each of the first teaching target 155*a* and the second teaching target 155*b*, to the teaching point T. In addition, the memory unit 62 contains the information used to identify the position of the first characterizing portion 51*a* and the information used to identify the position of the second characterizing portion 51*b*.

[Exemplary Operation]

Next, the exemplary operation of the robot 100 which is performed when the position of the teaching point T is taught to the robot 100, will be described.

Figure 5:
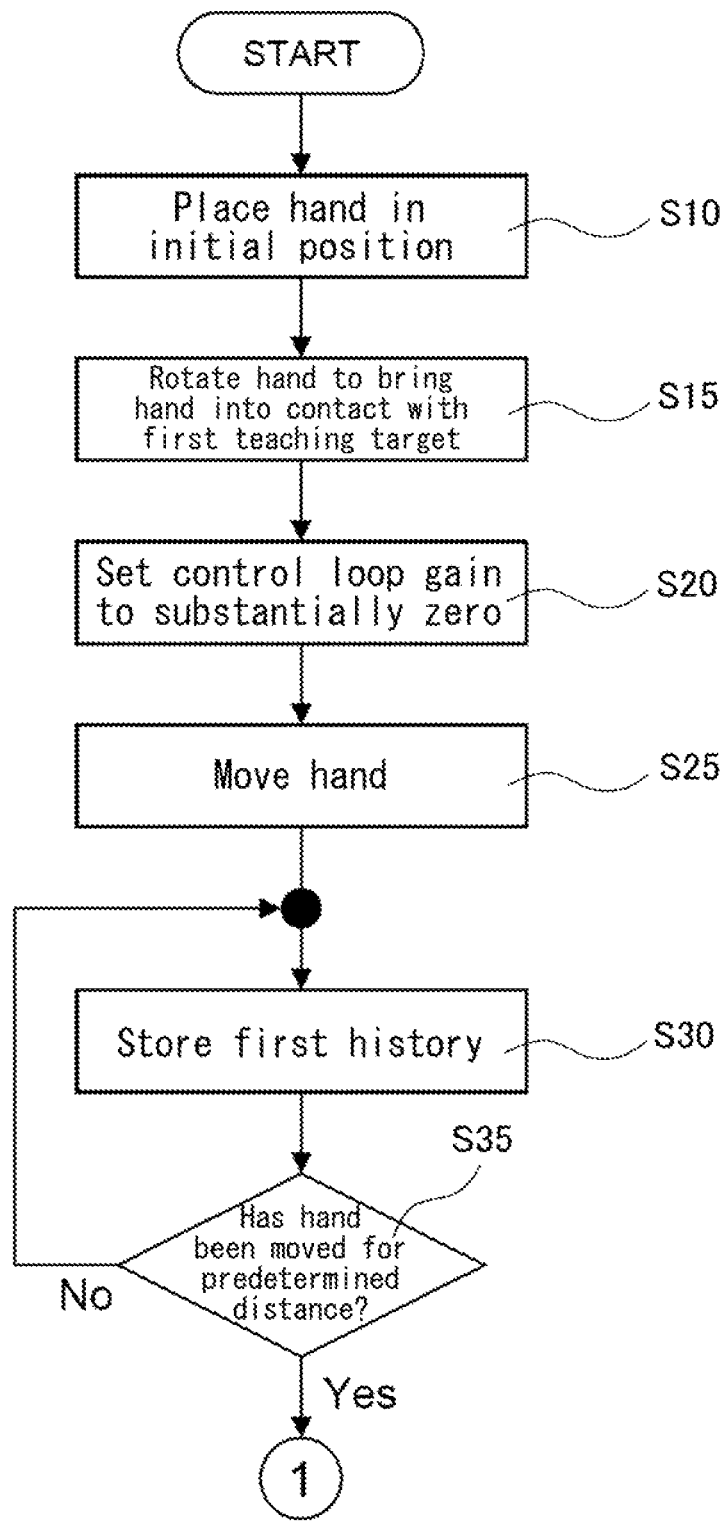
FIG. 5 is a flowchart showing the exemplary operation of the robot of FIG. 1.
Figure 6:
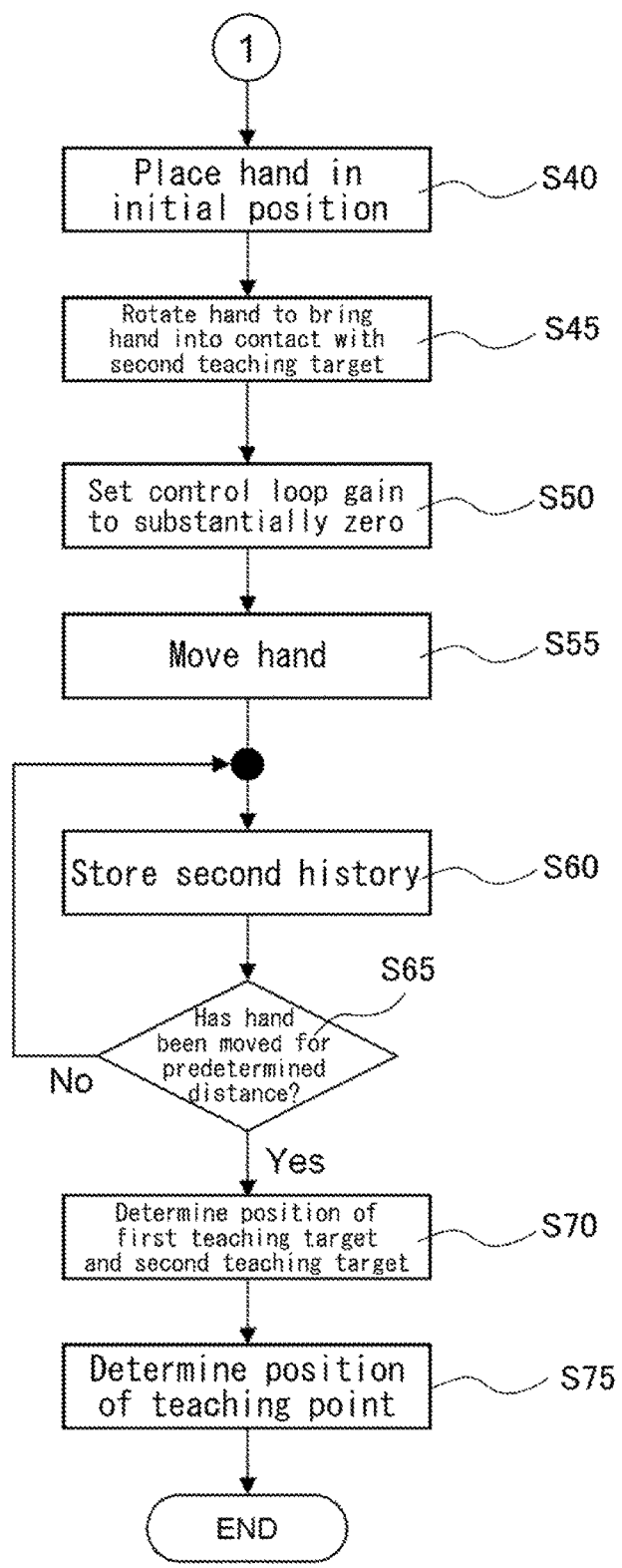
FIG. 6 is a flowchart showing the exemplary operation of the robot of FIG. 1.

FIGS. 5 and 6 are flowcharts each showing the exemplary operation of the robot 100 according to the embodiment of the present invention. FIGS. 7A to 7E are views each showing the exemplary operation of the robot 100 according to the embodiment of the present invention.

Figure 7A:
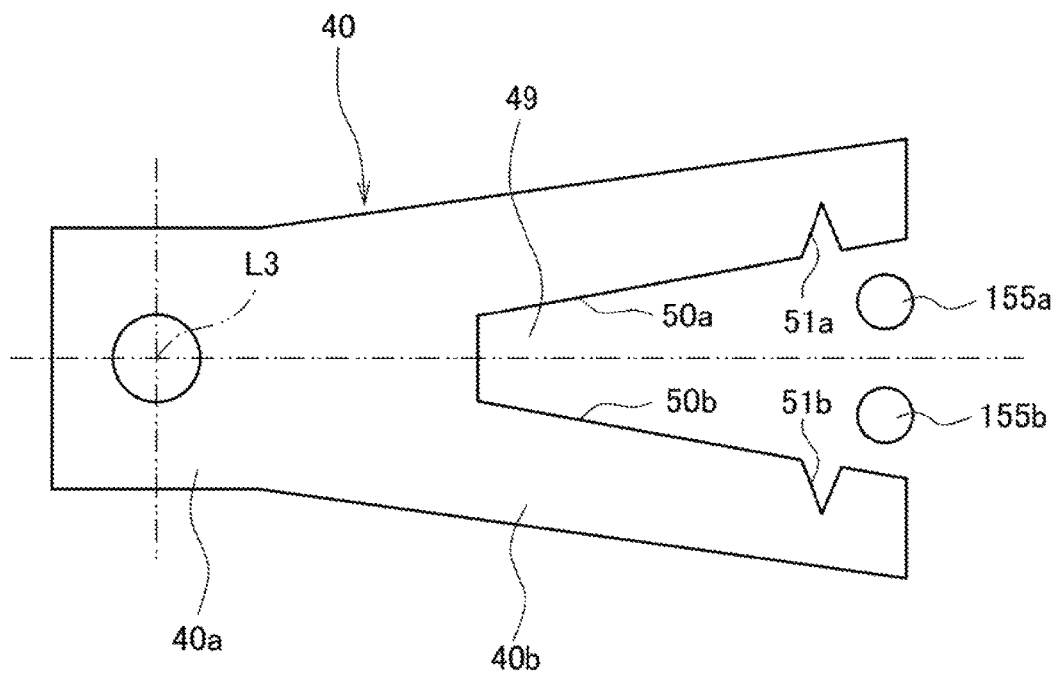
FIG. 7A is a view showing the exemplary operation of the robot of FIG. 1.
Figure 7A:
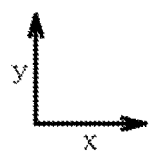

Initially, as shown in FIG. 7A, the control unit 61 places the hand 40 in an initial position (step S10). This initial position is stored in the memory unit 62. In the present embodiment, the initial position is a set position, at which the first teaching target 155*a* and the second teaching target 155*b* are located within a portion of a space 49, the portion being located at the tip end portion of the blade 40*b*. In the present embodiment, this initial position is stored in the memory unit 62, but the initial position of the hand 40 is not limited to this. Alternatively, for example, the position, at which the first teaching target 155*a* and the second teaching target 155*b* are located within a portion of the space 49, the portion being located at the tip end portion of the blade 40*b*, may be detected by a sensor, and the detected position may be set as the initial position.

Figure 7B:
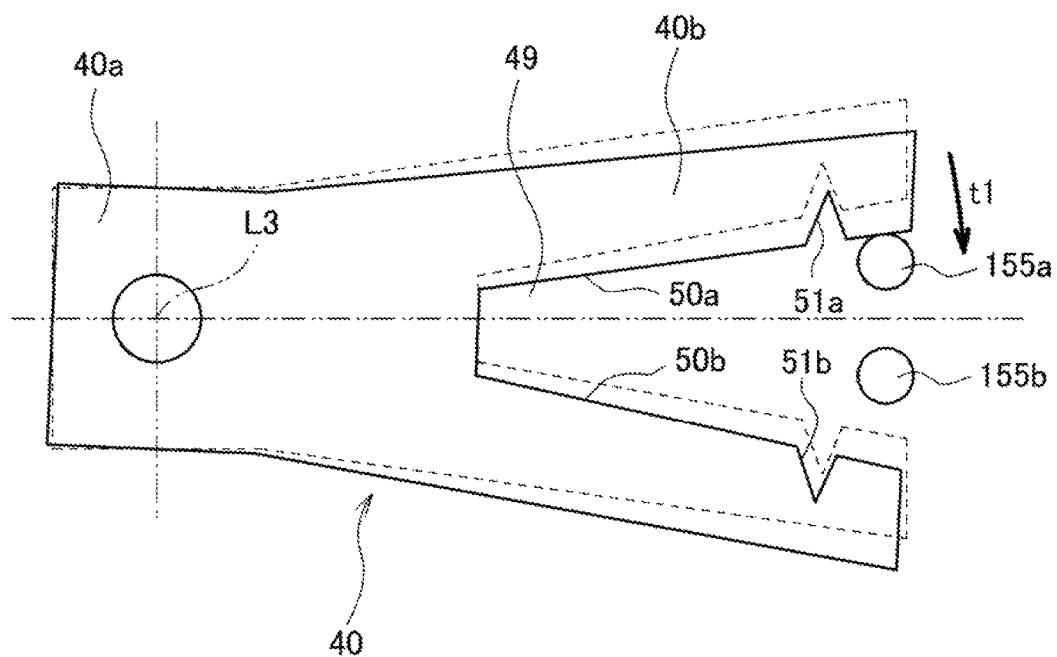
FIG. 7B is a view showing the exemplary operation of the robot of FIG. 1.

Then, as shown in FIG. 7B, the control unit 61 drives the hand drive unit 35 to rotate the hand 40 around the rotational axis L3, thereby bringing the first teaching target 155*a* and the first contact/slide surface 50*a* into contact with each other (step S15). Hereinafter, in some cases, this rotational direction will be referred to as a first rotational direction t1 and a direction opposite to the first rotational direction t1 will be referred to as a second rotational direction t2.

Then, the control unit 61 controls the hand drive unit 35 so that the hand 40 follows up a change in the shape of the first contact/slide surface 50*a*. In the present embodiment, the control unit 61 controls the hand drive unit 35 so that the hand 40 follows up the change in the shape of the first contact/slide surface 50*a*, by setting the angular position control loop gain of the hand drive unit 35 to substantially zero (step S20). The phrase "setting the control loop gain to substantially zero" means setting the control loop gain so that a state in which a force for rotating the hand 40 in a direction in which the contact/slide surface which is in contact with the teaching target is pressed against the teaching target, is applied to the hand 40, is maintained, while if a reactive force for rotating the hand 40 in a direction opposite to the direction in which the contact/slide surface is pressed against the teaching target, is received from the teaching target, the hand 40 accepts this reactive force, and is rotated in the direction opposite to the direction in which the contact/slide surface is pressed against the teaching target.

Figure 7C:
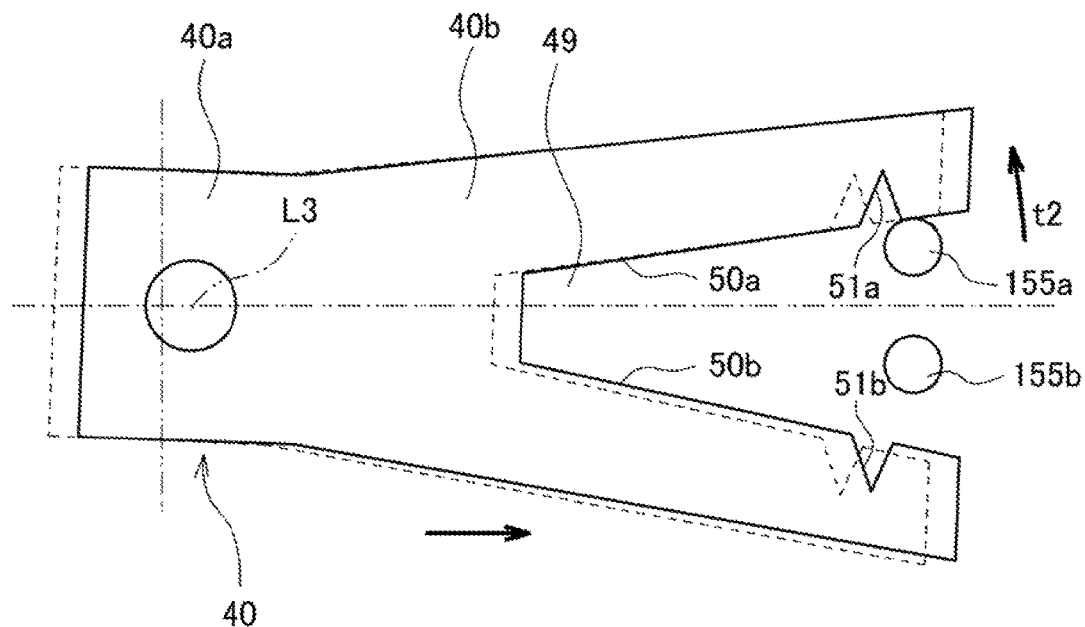
FIG. 7C is a view showing the exemplary operation of the robot of FIG. 1.
Figure 7C:
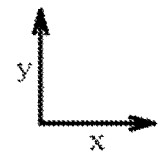

Then, as shown in FIG. 7C, the control unit 61 drives the lower arm drive unit 15 and the upper arm drive unit 25 to move the hand 40 in the direction in which the center line Lc extends (step S25). As described above, the first contact/slide surface 50*a* extends to be gradually close to the center line Lc, from the tip end portion of the blade 40*b* toward the base end portion of the blade 40*b*. Because of this, when the hand 40 is moved in the direction in which the center line Lc extends, the first contact/slide surface 50*a* of the blade 40*b* is pressed against the first teaching target 155*a*. Then, the hand 40 accepts the reactive force received from the first teaching target 155*a*, and is rotated in the second rotational direction t2 around the rotational axis L3. Thus, the angular position of the hand 40 is changed. The changed angular position of the hand 40 is detected by the hand angular position detecting section 37. Then, the first teaching target 155*a* and the first contact/slide surface 50*a* move relatively to each other in such a manner that the first teaching target 155*a* slides on the first contact/slide surface 50*a*. In other words, when the control unit 61 moves the hand 40 in the direction in which the center line Lc extends, the first teaching target 155*a* is moved relatively on the first contact/slide surface 50*a*, in the direction in which the first contact/slide surface 50*a* extends.

Then, the history storage section 68 starts to store the history of the relative angular position of the hand 40 changed with respect to the upper arm 30, around the rotational axis L3, the changed angular position being detected by the hand angular position detecting section 37 (step S30). This history is a first history H1.

Figure 7D:
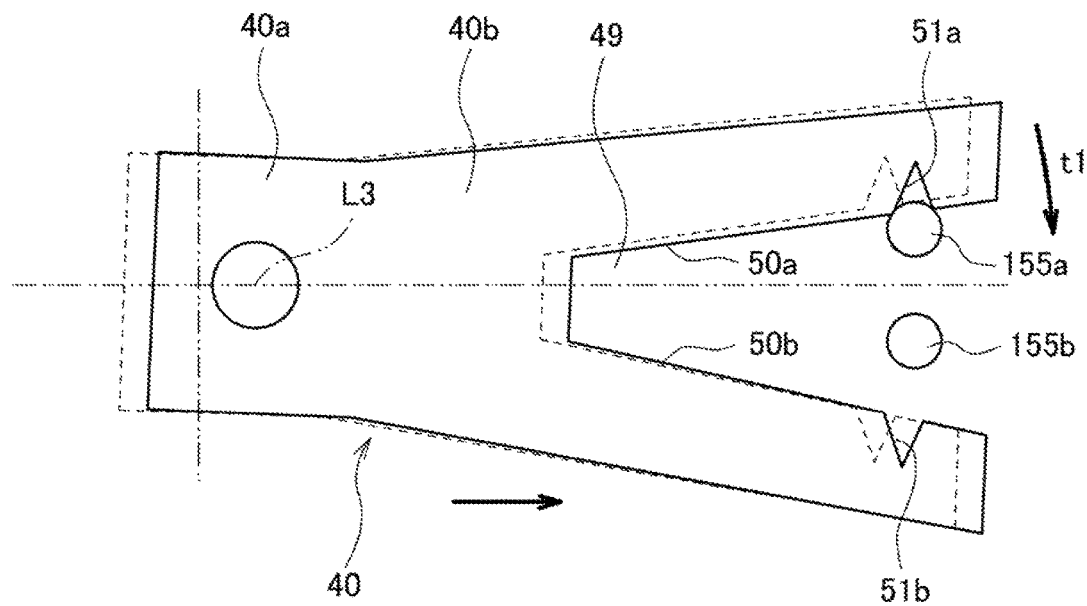
FIG. 7D is a view showing the exemplary operation of the robot of FIG. 1.
Figure 7E:
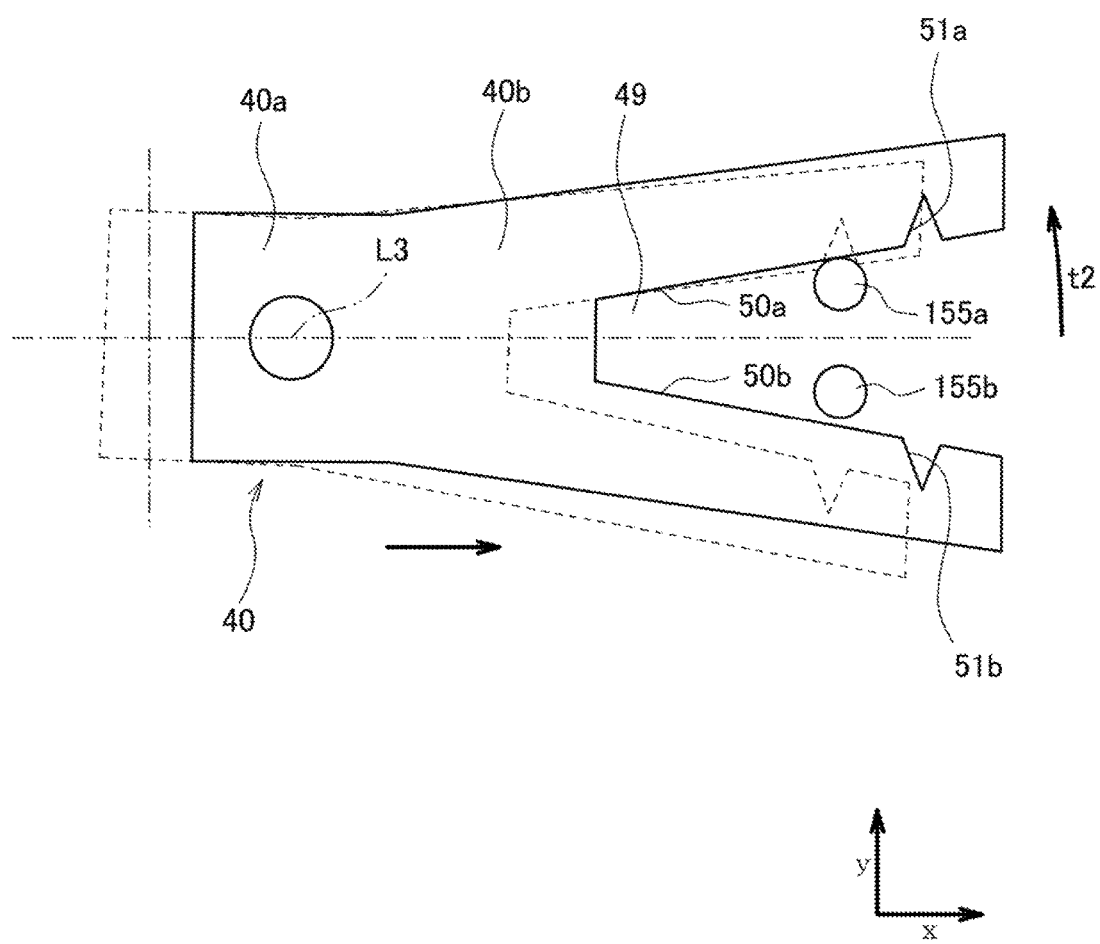
FIG. 7E is a view showing the exemplary operation of the robot of FIG. 1.

Then, the history storage section 68 stores the history until the hand 40 has been moved for a predetermined distance as shown in FIG. 7E (step S35). In the present embodiment, this predetermined distance is defined as a distance at which the first characterizing portion 51*a* and the second characterizing portion 51*b* of the blade 40*b* which have been moved from the initial position in the direction in which the center line L extends are located to be closer to the tip end of the blade 40*b* than the first teaching target 155*a* and the second teaching target 155*b* are.

As shown in FIG. 7D, when the first teaching target 155*a* is moved on the first contact/slide surface 50*a* and is located at the first characterizing portion 51*a*, the hand 40 follows up the change in the shape of the first characterizing portion 51*a* of the first contact/slide surface 50*a*, as described above. Therefore, the first teaching target 155*a* is moved from the first contact/slide surface 50*a* extending in a straight-line shape into the notch of the first characterizing portion 51*a*. As a result, the hand 40 is rotated to a great extent in the first rotational direction t1, and its angular position is changed significantly. In other words, in a range in which the hand 40 is moved in such a manner that the first teaching target 155*a* is moved relatively on the first contact/slide surface 50*a* extending in a straight-line shape, the change rate of the angular position of the hand 40 which is detected by the hand angular position detecting section 37 has a substantially constant value. In contrast, when the first teaching target 155*a* has moved into the first characterizing portion 51*a*, the change rate of the angular position of the hand 40 indicates a great value with the same sign as the value of the change rate of the angular position of the hand 40 in the above-described range in which the hand 40 is moved in such a manner that the first teaching target 155*a* is moved relatively on the first contact/slide surface 50*a* extending in a straight-line shape (see FIG. 8).

When the hand 40 is further moved in this state, the hand 40 accepts the reactive force received from the first teaching target 155*a*, and thereby follows up the change in the shape of the first characterizing portion 51*a* of the first contact/slide surface 50*a*, as described above. Therefore, the first teaching target 155*a* is moved out of the notch of the first characterizing portion 51*a* and returns onto the first contact/slide surface 50*a* extending in a straight-line shape. As a result, the hand 40 is rotated to a great extent in the second rotational direction t2, and its angular position is changed significantly. The change rate of the angular position of the hand 40 indicates a great value which is opposite in sign to the value of the change rate which occurs when the first teaching target 155*a* is moved into the first characterizing portion 51*a* (see FIG. 8).

As described above, the hand 40 is rotated to a great extent in the first rotational direction t1, when the first teaching target 155*a* is moved into the first characterizing portion 51*a*, and then is rotated to a great extent in the second rotational direction t2, and the change rate of the angular position of the hand 40 locally takes great values. In particular, in the present embodiment, since the first characterizing portion 51*a* is formed by the stepped portion, the change rate of the angular position of the hand 40 can be increased.

In the above-described manner, the control unit 61 executes the step S10 to the step S35, and thereby obtains the first history H1.

Then, the control unit 61 places the hand 40 in the initial position again (step S40).

Then, the control unit 61 drives the hand drive unit 35 to rotate the hand 40 around the rotational axis L3, thereby bringing the second teaching target 155*b* and the second contact/slide surface 50*b* into contact with each other (step S45). The first contact/slide surface 50*a* and the second contact/slide surface 50*b* are configured to face each other. In this configuration, by changing the rotational direction of the hand 40 placed in the initial position, the control unit 61 chooses either one of the first contact/slide surface 50*a* and the second contact/slide surface 50*b*, as the contact/slide surface which contacts the teaching target. Therefore, teaching with respect to the robot 100 can be performed easily. After the step S35 is executed, the hand 40 is moved for a short distance to bring the second teaching target 155*b* and the second contact/slide surface 50*b* into contact with each other. This makes it possible to lessen reduction of detection accuracy due to, for example, the backlash (looseness) of the arm, or the like of the robot 100. As a result, the detection accuracy can be improved.

Then, the control unit 61 controls the hand drive unit 35 so that the hand 40 can follow up a change in the shape of the second contact/slide surface 50*b*. In the present embodiment, the control unit 61 controls the hand drive unit 35 so that the hand 40 can follow up the change in the shape of the first contact/slide surface 50*a*, by setting the control loop gain of the hand drive unit 35 to substantially zero (step S50).

Then, the control unit 61 drives the lower arm drive unit 15 and the upper arm drive unit 25 to move the hand 40 in the direction in which the center line Lc extends (step S55). As described above, the second contact/slide surface 50*b* extends to be gradually close to the center line Lc, from the tip end portion of the hand 40 toward the base end portion of the hand 40. Because of this, when the hand 40 is moved in the direction in which the center line Lc extends, the second contact/slide surface 50*b* of the blade 40*b* is pressed against the second teaching target 155*b*. Then, the hand 40 accepts a reactive force received from the second teaching target 155*b*, and is rotated in the first rotational direction t1 around the rotational axis L3. Thus, the angular position of the hand 40 is changed. The changed angular position of the hand 40 is detected by the hand angular position detecting section 37. Then, the second teaching target 155*b* and the second contact/slide surface 50*b* are moved relatively to each other in such a manner that second teaching target 155*b* slides on the second contact/slide surface 50*b*. In other words, when the control unit 61 moves the hand 40 in the direction in which the center line Lc extends, the second teaching target 155*b* is moved relatively on the second contact/slide surface 50*b*, in the direction in which the second contact/slide surface 50*b* extends. Note that the direction in which the hand 40 is moved in the above-described step S25 and step S55 is not limited to the direction in which the center line Lc extends. Alternatively, the hand 40 may be moved in a desired direction in which the teaching target and the contact/slide surface are moved relatively to each other, in the direction in which the contact/slide surface extends.

Then, the history storage section 68 starts to store the history of the relative angular position of the hand 40 which is changed with respect to the upper arm 30, around the rotational axis L3, the changed angular position being detected by the hand angular position detecting section 37 (step S60). This history is a second history H2.

Then, the history storage section 68 stores the history until the hand 40 has been moved for a predetermined distance (step S65).

When the second teaching target 155*b* is moved on the second contact/slide surface 50*b* and is located at the first characterizing portion 51*b*, the hand 40 can follow up a change in the shape of the second characterizing portion 51*b* of the second contact/slide surface 50*b*, as described above. In this configuration, the second teaching target 155*b* is moved from the second contact/slide surface 50*b* extending in a straight-line shape into the notch of the second characterizing portion 51*b*. As a result, the hand 40 is rotated to a great extent in the second rotational direction t2, and its angular position is changed significantly. In other words, in a range in which the hand 40 is moved in such a manner that the second teaching target 155*b* is moved relatively on the second contact/slide surface 50*b* extending in a straight-line shape, the change rate of the angular position of the hand 40 which is detected by the hand angular position detecting section 37 has a substantially constant value. In contrast, when the second teaching target 155*b* is moved into the second characterizing portion 51*b*, the change rate of the angular position of the hand 40 indicates a great value with the same sign as that of the value of the change rate of the angular position of the hand 40 in the above-described range in which the hand 40 is moved in such a manner that the second teaching target 155*b* is moved relatively on the second contact/slide surface 50*b* extending in a straight-line shape (see FIG. 8).

When the hand 40 is further moved in this state, the hand 40 accepts a reactive force received from the second teaching target 155*b*, and thereby can follow up the change in the shape of the second characterizing portion 51*b* of the second contact/slide surface 50*b*, as described above. Therefore, the second teaching target 155*b* is moved out of the notch of the second characterizing portion 51*b* and returns onto the second contact/slide surface 50*b* extending in a straight-line shape. As a result, the hand 40 is rotated to a great extent in the first rotational direction t1, and its angular position is changed significantly. The change rate of the angular position of the hand 40 indicates a great value which is opposite in sign to the value of the change rate of the angular position which occurs when the second teaching target 155*b* is moved into the second characterizing portion 51*b* (see FIG. 8).

As described above, the hand 40 is rotated to a great extent in the second rotational direction t2, when the second teaching target 155*b* is moved into the second characterizing portion 51*b*, and then is rotated to a great extent in the first rotational direction t1, and the change rate of the angular position of the hand 40 locally takes the great values. In particular, in the present embodiment, since the second characterizing portion 51*b* is formed by the stepped portion, the change rate of the angular position of the hand 40 can be increased.

In the above-described manner, the control unit 61 executes the step S40 to the step S65, and thereby obtains a second history H2.

Then, the target position determination section 70 determines the position of the first teaching target 155*a* and the position of the second teaching target 155*b*, based on the first history H1 and the second history H2, respectively.

Figure 8:
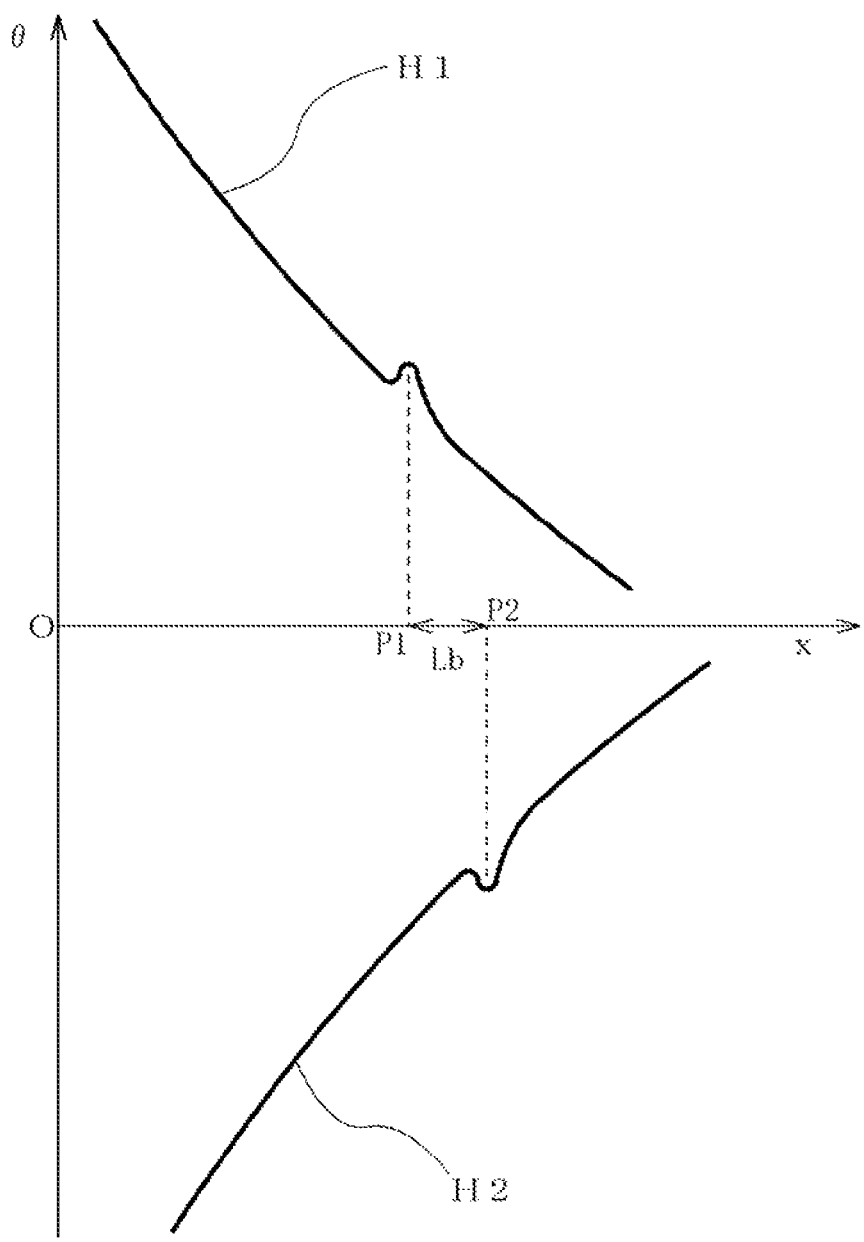
FIG. 8 is a graph showing an exemplary relationship between the position of a hand in an x-direction and the relative angular position of the hand with respect to an upper arm in the exemplary operation of the robot of FIG. 1.

FIG. 8 is a graph showing the exemplary relationship between the position of the hand in the x-direction and the relative angular position of the hand with respect to the upper arm, which is on the basis of the information included in the above-described first history H1 and the information included in the second history H2. In this graph, a vertical axis θ indicates the relative angular position θ of the hand 40 with respect to the x-direction, while a horizontal axis x indicates the position of the hand 40 in the x-direction.

As can be seen from the first history H1 and the second history H2, the value of θ is changed significantly at a point P1 at which the first teaching target 155*a* is located at the first characterizing portion 51*a* and a point P2 at which the second teaching target 155*b* is located at the second characterizing portion 51*b*. Firstly, the target position determination section 70 determines the position of the point P1 and the position of the point P2 of the hand at which the value of θ in the x-direction is changed significantly, for the first history H1 and the second history H2, respectively. In the present embodiment, the target position determination section 70 determines as the position of the point P1 and the position of the point P2, the positions of the hand 40 at which the sign of the change rate of θ in a range in which the change rate of θ exceeds a predetermined threshold is inverted. In this way, the target position determination section 70 determines the position of the point P1 and the position of the point P2, based on the range in which the change rate of θ exceeds the predetermined threshold, and the inversion of the sign of the change rate of θ. This makes it possible to accurately detect the position of the first characterizing portion 51*a* and the position of the second characterizing portion 51*b*. As described above, in particular, in the present embodiment, each of the first characterizing portion 51*a* and the second characterizing portion 51*b* is formed by the stepped portion. Therefore, when the first teaching target 155*a* is moved into the first characterizing portion 51*a* and the second teaching target 155*b* is moved into the second characterizing portion 51*b*, the change rates of the angular position of the hand 40 have the great values, respectively. As a result, the position of the point P1 and the position of the point P2 can be determined accurately.

In some cases, as shown in FIG. 8, the position of the point P1 and the position of the point P2 do not conform to each other, because the first characterizing portion 51*a* and the second characterizing portion 51*b* are not arranged side by side in a direction in which the first teaching target 155*a* and the second teaching target 155*b* are arranged side by side. In these cases, the control unit 61 may determine a hand compensation angle θa according to the following formula, and then compensate the angle of the hand. Under this condition, the control unit 61 may execute the steps S10 to S65 again.

$$\theta a = \arctan(Lb/La)$$

where La is a distance between the first characterizing portion 51*a* and the second characterizing portion 51*b*, in the y-direction, and Lb is a distance between the point P1 and the point P2 in the x-direction.

Then, the target position determination section 70 determines the position of the first teaching target 155*a* and the position of the second teaching target 155*b*, based on the position of the first characterizing portion 51*a* and the position of the second characterizing portion 51*b* at the point P1 and the point P2, respectively. In the present embodiment, a position P1$x$ and a position P2$x$ in the x-direction, of the first teaching target 155*a* and the second teaching target 155*b*, and a position P1$y$ and a position P2$y$ in the y-direction, of the first teaching target 155*a* and the second teaching target 155*b*, are determined according to the following formula:

$$P1x = L3x + R \cdot \cos(\theta c + \alpha)$$

$$P1y = L3y + R \cdot \sin(\theta c + \alpha)$$

$$P2x = L3x + R \cdot \cos(\theta c - \alpha)$$

$$P2y = L3y + R \cdot \sin(\theta c - \alpha)$$

where θc is an angle formed between the center line Lc of the hand 40 and the x-axis, on the x-y flat plane, R is a distance between the rotational axis L3 and each of the first characterizing portion 51*a* and the second characterizing portion 51*b* of the blade 40*b*, on the x-y flat plane (see FIG. 2), (Since the first characterizing portion 51a and the second characterizing portion 51b are configured to be line-symmetric with respect to the center line Lc as described above, the distance R corresponding to the first characterizing portion 51a is equal to the distance R corresponding to the second characterizing portion 51b), α is an angle formed between the center line Lc and a line connecting the first characterizing portion 51a to the rotational axis L3, on the x-y flat plane (see FIG. 2)

(Since the first characterizing portion 51a and the second characterizing portion 51b are configured to be line-symmetric with respect to the center line Lc as described above, an angle formed between the center line Lc and a line connecting the second characterizing portion 51 to the rotational axis L3, on the x-y flat plane, is −α), L3x is the position of the rotational axis L3 in the x-direction on the x-y flat plane, and L3y is the position of the rotational axis L3 in the y-direction on the x-y flat plane.

Then, the teaching point position determination section 69 determines the position Tx of the teaching point T in the x-direction and the position Ty of the teaching point T in the y-direction, based on the position of the first teaching target 155a and the position of the second teaching target 155b. As described above, in the present embodiment, the teaching point T is located at the distance d from the center of the line connecting the first teaching target 155a and the second teaching target 155b to each other, in the direction the line perpendicular to the line connecting the first teaching target 155a and the second teaching target 155b to each other extends, and is determined according to the following formula:

$$Tx=((Px1+Px2)/2)+d\cdot(|Py2-Py1|/L)$$

$$Tx=((Py1+Py2)/2)+d\cdot(|Px2-Px1|/L)$$

$$L=\sqrt{((Px2-Px1)^2+(Py2-Py1)^2)}$$

In the above-described manner, in the present embodiment, the control unit 61 detects the position of the first teaching target 155a and the position of the second teaching target 155b, and then determines the position of the teaching point T. Therefore, irrespective of the position of the FOUP 150 when viewed from the vertical direction, the position of the teaching point T can be detected accurately.

As should be appreciated from the above, the hand 40 of the robot 100 of the present invention includes the characterizing portions having the bent points, respectively. Therefore, it becomes possible to detect the positions of the hand 40 at the time points when the teaching targets are located at the characterizing portions, respectively, based on the changes in the angular positions of the hand 40 on the x-y flat plane, the changes occurring due to the characterizing portions, and detect the positions of the teaching targets in the x-direction and in the y-direction based on the detected positions of the hand 40. As a result, it becomes possible to quickly detect the positions of the teaching targets, and quickly teach the position of the teaching point T based on the detected positions of the teaching targets.

In the robot 100 of the present invention, the first characterizing portion 51a of the blade 40b is the recess which is depressed from the first contact/slide surface 50a, and the second characterizing portion 51b of the blade 40b is the recess which is depressed from the second contact/slide surface 50b. In this configuration, the hand 40 is rotated to a great extent, and the change rate of the angular position of the hand 40 locally takes the great value, when each of the teaching targets is located at the corresponding characterizing portion. Thus, the position of the teaching target can be detected accurately.

By additionally processing the blade of the conventional hand to form the first contact/slide surface 50a including the first characterizing portion 51a and the second contact/slide surface 50b including the second characterizing portion 51b, the teaching with respect to the conventional robot can be performed. Thus, the robot of the present invention can be easily manufactured at low manufacturing cost.

Modified Example

Although in the above-described embodiment, the hand 40 is rotated to contact the teaching target in each of the step S15 and the step S45, this is merely exemplary. Alternatively, the hand 40 may be moved in the y-direction to contact the teaching target.

Although in the above-described embodiment, the first characterizing portion 51a and the second characterizing portion 51b are the notches formed by carving the first contact/slide surface 50a and the second contact/slide surface 50b, respectively, the first characterizing portion 51a and the second characterizing portion 51b are not limited to the notches formed in this way. Alternatively, the first characterizing portion 51a and the second characterizing portion 51b may be convex portions protruding from the first contact/slide surface 50a and the second contact/slide surface 50b, respectively.

In a case where the first characterizing portion 51a and the second characterizing portion 51b are the convex portions, respectively, the angular position control loop of the hand drive unit 35 may be set to zero.

Figure 9:
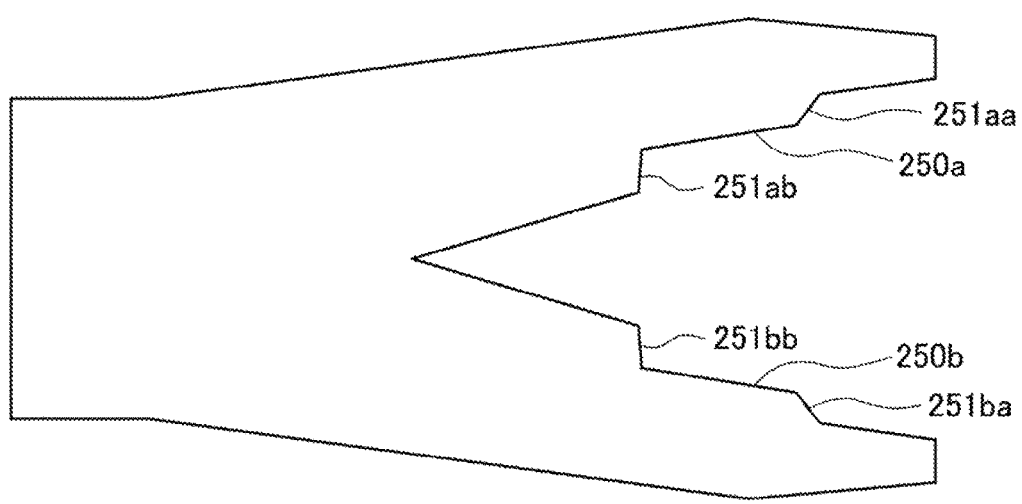
FIG. 9 is a view showing Modified Example of the hand of the robot according to the embodiment of the present invention.
Figure 10:
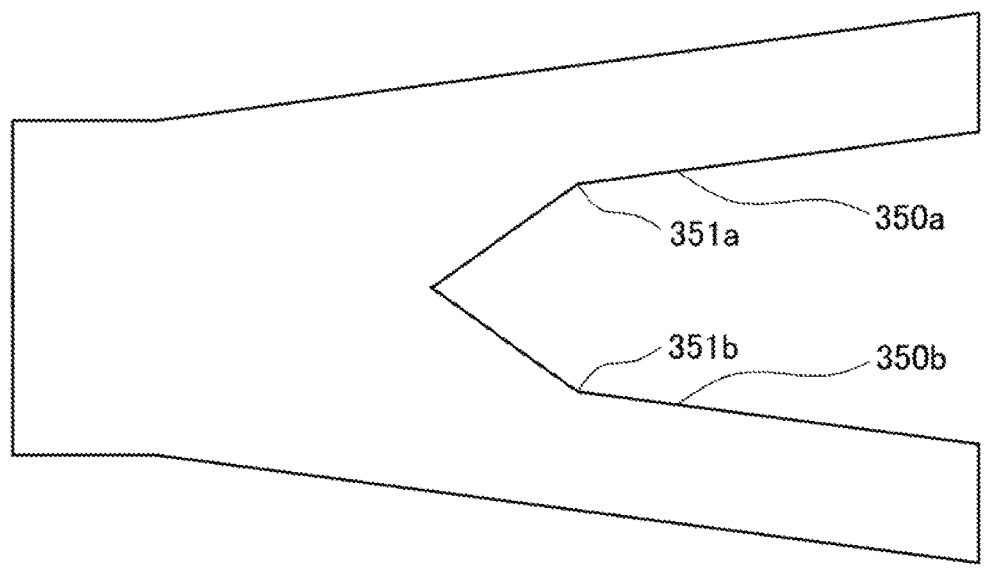
FIG. 10 is a view showing Modified Example of the hand of the robot according to the embodiment of the present invention.

Although in the above-described embodiment, the contact/slide surfaces extend in the straight-line shape, the shape of the contact/slide surfaces is not limited to this shape. Alternatively, as shown in FIG. 9, a first contact/slide surface 250a and a second contact/slide surface 250b may be formed to extend stepwisely, when viewed from the normal-line direction of the x-y flat plane, the first contact/slide surface 250a may be formed with first characterizing portions 251aa, 251ab, and the second contact/slide surface 250b may be formed with second characterizing portions 251ba, 251bb. Further, as shown in FIG. 9, a first contact/slide surface 350a and a second contact/slide surface 350b may be formed to extend to be bent when viewed from the normal-line direction of the x-y flat plane, the first contact/slide surface 350a may be formed with a first characterizing portion 351a, and the second contact/slide surface 350b may be formed with a second characterizing portion 351b.

INDUSTRIAL APPLICABILITY

The present application is applicable to a robot which conveys substrates in equipment in which substrates are treated.

REFERENCE SIGNS LIST 10 base body
15 lower arm drive unit
16 lower arm rotation drive gear
18 up-down mechanism
19 up-down mechanism drive unit
20 lower arm
21 lower arm rotary shaft
22 lower arm rotation driven gear 25 upper arm drive unit
26 upper arm rotation drive gear
30 upper arm
31 upper arm rotary shaft
32 upper arm rotation driven gear
35 hand drive unit
36 hand rotation drive gear
37 hand angular position detecting section
40 hand
40a wrist
40b blade
41 hand rotary shaft
42 hand rotation driven gear
49 space
50a first contact/slide surface
50b second contact/slide surface
51a first characterizing portion
51b second characterizing portion
61 control unit
62 memory unit
64 lower atm control section
65 upper arm control section
66 hand control section
67 up-down mechanism control section
68 history storage section
69 teaching point position determination section
70 target position determination section
100 robot
150 FOUP
151 side wall
152 upper wall
153 lower wall
154 substrate support section
155a first teaching target
155b second teaching target
156 front opening

The invention claimed is:

1. A robot comprising:
a robot arm including an arm, and a hand attached to a tip end portion of the arm such that the hand is rotatable around a rotational axis of the hand;
an arm drive unit which drives the arm to move the hand;
a hand drive unit which rotates the hand;
a hand angular position detecting section which detects an angular position of the hand around the rotational axis; and
a control unit which controls the arm drive unit and the hand drive unit,
wherein the hand includes a wrist provided on a base end side of the hand and a blade provided on a tip end side of the hand and configured to retain a substrate,
wherein the blade has a contact/slide surface which extends in a first direction, contacts a teaching target and slides relatively on the teaching target, and
wherein the contact/slide surface includes a characterizing portion having a bent point in the first direction.

2. The robot according to claim 1,
wherein the characterizing portion is a stepped portion in the first direction.

3. The robot according to claim 1,
wherein the control unit is configured to control at least the arm drive unit to move the hand so that the teaching target is moved relatively on the contact/slide surface in the first direction or a direction opposite to the first direction, and to detect a position of the teaching target based on a changed angular position of the hand in a direction crossing the first direction, the changed angular position occurring due to the characterizing portion and being detected by the hand angular position detecting section.

4. The robot according to claim 3,
wherein the control unit is configured to control the hand drive unit to cause the hand to follow up a change in a shape of the characterizing portion of the contact/slide surface.

5. The robot according to claim 1,
wherein the characterizing portion is a convex portion protruding from the contact/slide surface or a recess depressed from the contact/slide surface.

6. The robot according to claim 3,
wherein the characterizing portion is a notch formed by carving the contact/slide surface.

7. A method of controlling a robot including:
a robot arm including an arm, and a hand attached to a tip end portion of the arm such that the hand is rotatable around a rotational axis of the hand;
an arm drive unit which drives the arm to move the hand;
a hand drive unit which rotates the hand;
a hand angular position detecting section which detects an angular position of the hand around the rotational axis; and
a control unit which controls the arm drive unit and the hand drive unit,
wherein the hand includes a wrist provided on a base end side of the hand and a blade provided on a tip end side of the hand and configured to retain a substrate,
wherein the blade has a contact/slide surface which extends in a first direction, contacts a teaching target and slides relatively on the teaching target, and
wherein the contact/slide surface includes a characterizing portion having a bent point in the first direction,
the method comprising:
controlling, with the control unit, at least the arm drive unit to move the hand so that the teaching target is moved relatively on the contact/slide surface in the first direction or a direction opposite to the first direction, and detecting a position of the teaching target based on a changed angular position of the hand in a direction crossing the contact/slide surface, the changed angular position occurring due to the characterizing portion and being detected by the hand angular position detecting section.

8. The method according to claim 7,
wherein the characterizing portion is a notch formed by carving the contact/slide surface.

* * * * *